United States Patent [19]
Lee

[11] Patent Number: 6,091,142
[45] Date of Patent: Jul. 18, 2000

[54] ASSEMBLY FOR DISSIPATING HEAT FROM A STACKED SEMICONDUCTOR PACKAGE

[75] Inventor: Won Sang Lee, Seoul, Rep. of Korea

[73] Assignee: LG Electronics, Inc., Seoul, Rep. of Korea

[21] Appl. No.: 08/991,239

[22] Filed: Dec. 16, 1997

[30] Foreign Application Priority Data

Dec. 16, 1996 [KR] Rep. of Korea ............... 96/66223

[51] Int. Cl.[7] .................. H01L 23/34; H01L 23/495; H01L 23/10
[52] U.S. Cl. .................. 257/713; 257/668; 257/686; 257/706; 257/712; 257/723; 257/724
[58] Field of Search .................. 257/712, 706, 257/723, 668, 686, 713, 724; 438/109, 118, 123

[56] References Cited

U.S. PATENT DOCUMENTS

| | | | |
|---|---|---|---|
| 5,471,011 | 11/1995 | Maslakow | 274/52.4 |
| 5,757,075 | 5/1998 | Kitaoka | 257/712 |
| 5,773,879 | 6/1998 | Fusayasu et al. | 257/678 |

FOREIGN PATENT DOCUMENTS

| | | |
|---|---|---|
| 61-270187 | 5/1988 | Japan . |
| 3295265 | 12/1991 | Japan . |
| 2-138047 | 2/1992 | Japan . |
| 2-181416 | 3/1992 | Japan . |
| 4290466 | 10/1992 | Japan . |

Primary Examiner—Olik Chaudhuri
Assistant Examiner—Alonzo Chambliss
Attorney, Agent, or Firm—John P. White; Cooper & Dunham LLP

[57] ABSTRACT

A stacked semiconductor package and a method for assembling the same are disclosed, the stacked semiconductor package including a semiconductor chip having a plurality of wire bonding pads thereon; leads formed in a direction to electrically connect with the wire bonding pads; a heat sink connected to the predetermined wire bonding pad to radiate out heat of the semiconductor chip; and an epoxy supporting and protecting the semiconductor chip, the leads, and the heat sink.

10 Claims, 5 Drawing Sheets

FIG. 1

| | DIP | ZIP | SOJ | TSOJ | TSOP |
|---|---|---|---|---|---|
| package height (mm) Ratio | 5.08max / 1.35(1) | 10.16max / 2.70(2) | 3.76max / 1(0.74) | 1.38max / 0.5(0.35) | 1.27max / 0.34(0.25) |
| package size (mm) Ratio | 10.16max × 8.62max / 1.43(1) | 28.11max × 3.54max / 0.63(0.44) | 17.28max × 8.54max / 1(0.70) | 17.28max × 8.54max / 0.5(0.35) | 16.2max × 6.2max / 0.68(0.48) |
| package volume (mm) Ratio | 1073 / 1.92(1) | 939 / 1.68(0.87) | 558 / 1(0.52) | 263 / 0.47(0.25) | 128 / 0.23(0.12) |
| body thickness (mm) Ratio | 3.6 / 1.33(1) | 2.85 / 1.06(0.79) | 2.7 / 1(0.71) | 1.6 / 0.59(0.44) | 1.0 / 0.37(0.28) |
| soldering pitch (mm) | 2.54(100mil) | 1.27(50mil) | 1.27(50mil) | 1.27(50mil) | 0.50(=20mil) |
| package weight (mm) Ratio | 1.34 / 1.63(1) | 1.63(1) / 1.63(1) | 0.82 / 1(0.61) | 0.48 / 0.59(0.36) | 0.22 / 0.27(0.16) |

( ) is ratio when DIP is 1.0
Ratio when SOJ is 1.0

ASSEMBLY FOR DISSIPATING HEAT FROM A STACKED SEMICONDUCTOR PACKAGE

BACKGROUND OF THE INVENTION

1. Field of the Invention

The present invention relates to a semiconductor package and, more particularly, to a stacked semiconductor package and a method for assembling the same.

2. Discussion of the Related Art

Semiconductor package is classified into inline package and outline package. DIP (dual inline package), SIP (single inline package), and PGA (pin grid array) belong to the inline package where pins are inserted into holes formed on print wire plates without package lead and are soldered. DIP and SIP are of a lead frame type and PGA is of a pin type.

As for outline package, holes are unnecessary. It is mounted on one surface or both surfaces of an IC wire plate. This kind of package is very light and simple and the packaging density of a wire plate is much enhanced. Individual packages such as SOP (small outline package), TSOP (thin small outline package), SOJ (small outline J-bend), and TQFP (thin quad flat package) belong to the outline package.

As for system package, there are TAB (tape automated bonding), C-4, Bear chips, and so forth.

FIG. 1 shows comparisons of various kinds of packages in forms, sizes, heights and so on. FIG. 2 is an example of a multi chip module.

As shown in FIGS. 1 and 2, all packages have very big sizes. Besides, it is necessary to assemble individually-packaged chips. In other words, though chips having diverse functions are integrated in packages with the MCM (multi chip module) method, many process steps of installing chips on a ceramic substrate, which it is difficult to fabricate, and possibility of generation of failures is high. Moreover, when a failure is generated, it is difficult to find out which chip has the failure. Thus, to prevent such a problem, packaged chips are installed on a ceramic substrate. As a result, unnecessary process steps are added and the production cost is increased, though.

The background semiconductor package has the following problems. Since individual chips should be assembled, the external sizes of the chips are very big. Further, since packaged chips are installed on a ceramic substrate, the process becomes complicated and the possibility of generation of failures becomes heightened, and the production cost becomes expensive. Furthermore, it is hard to diverge and repair when failures are generated.

SUMMARY OF THE INVENTION

Therefore, the present invention is directed to semiconductor package that substantially obviates one or more of problems due to limitations and disadvantages of the related art.

An object of the invention is to provide a stacked semiconductor package and a method for assembling the same where a plurality of chips are made stacked to reduce the area of a semiconductor package and the assembling process is simplified.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the stacked semiconductor package includes a semiconductor chip having a plurality of wire bonding pads thereon; leads formed in a direction to electrically connect with the wire bonding pads; a heat sink connected to the predetermined wire bonding pad to radiate out heat of the semiconductor chip; and an epoxy supporting and protecting the semiconductor chip, the leads, and the heat sink.

In another aspect, a semiconductor package includes a semiconductor chip having a plurality of wire bonding pads thereon; leads formed in a direction to electrically connect with the wire bonding pads; a first heat sink connected with the wire bonding pads to radiate heat of the semiconductor chip; a becker supporting the semiconductor chip and the leads; a second heat sink formed interposed in the becker to radiate heat of the semiconductor chip; and a cap placed over the semiconductor chip to support the leads and protect the semiconductor chip.

In still another aspect, a method for assembling a stacked semiconductor package includes the steps of preparing a semiconductor chip having a plurality of wire bonding pads thereon, a baker having a second heat sink, and a cap; arranging a plurality of leads and a first heat sink on the semiconductor chip, the cap on the plurality of leads, and the baker under the semiconductor chip; and simultaneously attaching the first heat sink and the leads on the wire bonding pads, the cap on the first heat sink and the lead, and the baker under the semiconductor chip and the leads.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which:

FIG. 1 shows comparisons of packages frequently used in memory devices in form, height, size, etc.;

DETAILED DESCRIPTION OF THE PREFERRED EMBODIMENTS

Reference will now be made in detail to the preferred embodiments of the present invention, examples of which are illustrated in the accompanying drawings.

Figure 2:
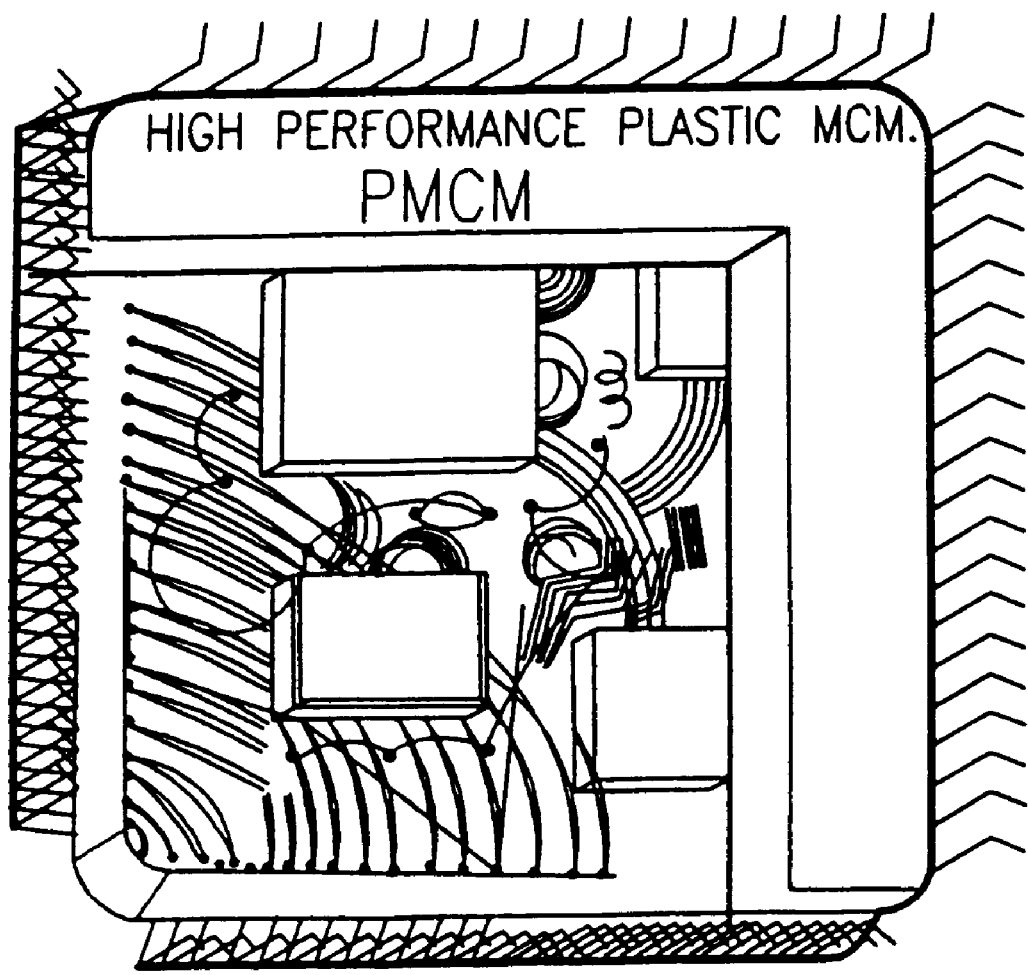
FIG. 2 is a view showing a package realizing multi chips.
Figure 3A:
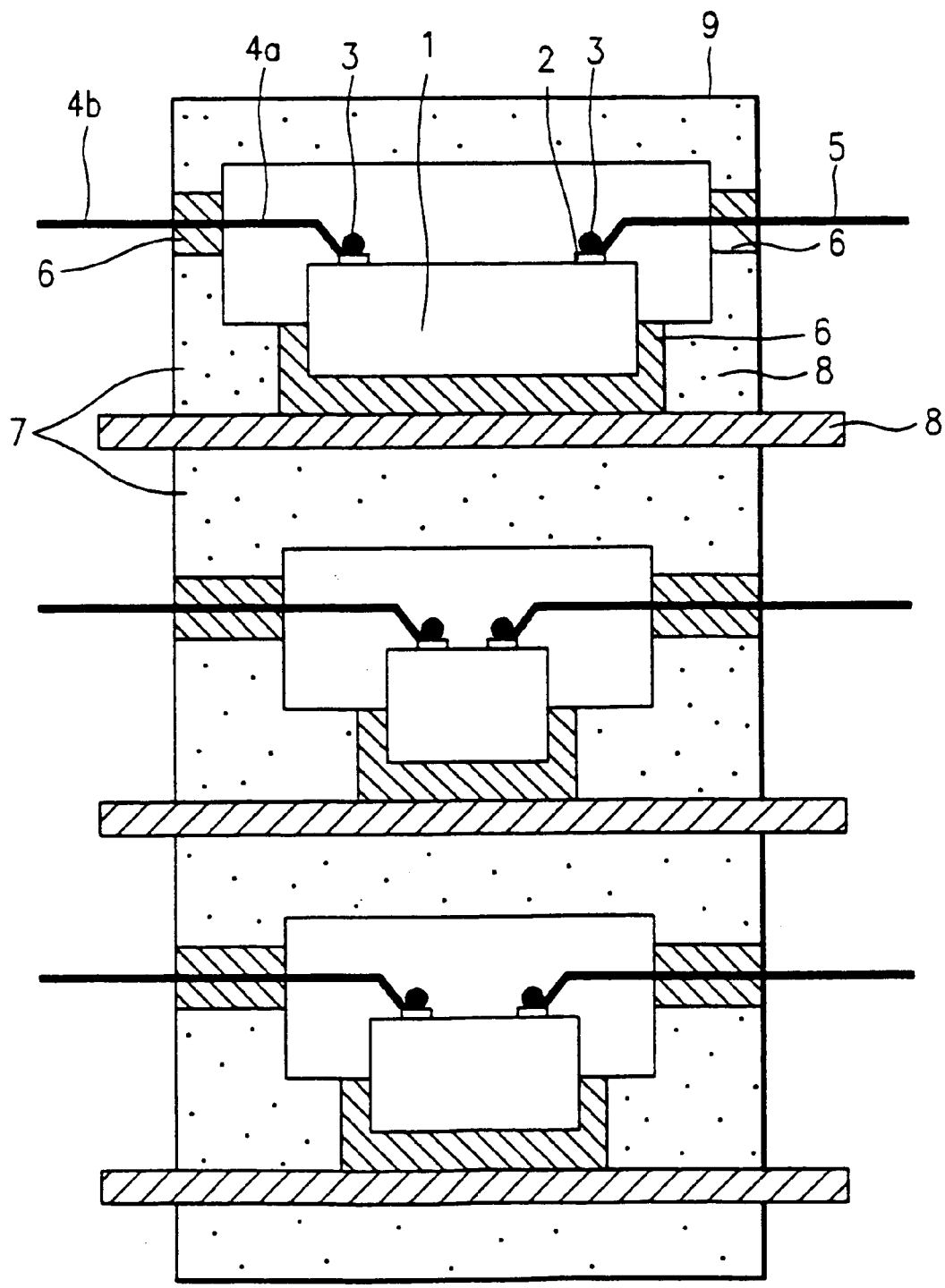
FIGS. 3A and 3B are a cross-sectional view and a perspective view, respectively, of a stacked semiconductor package according to the present invention.
Figure 3B:
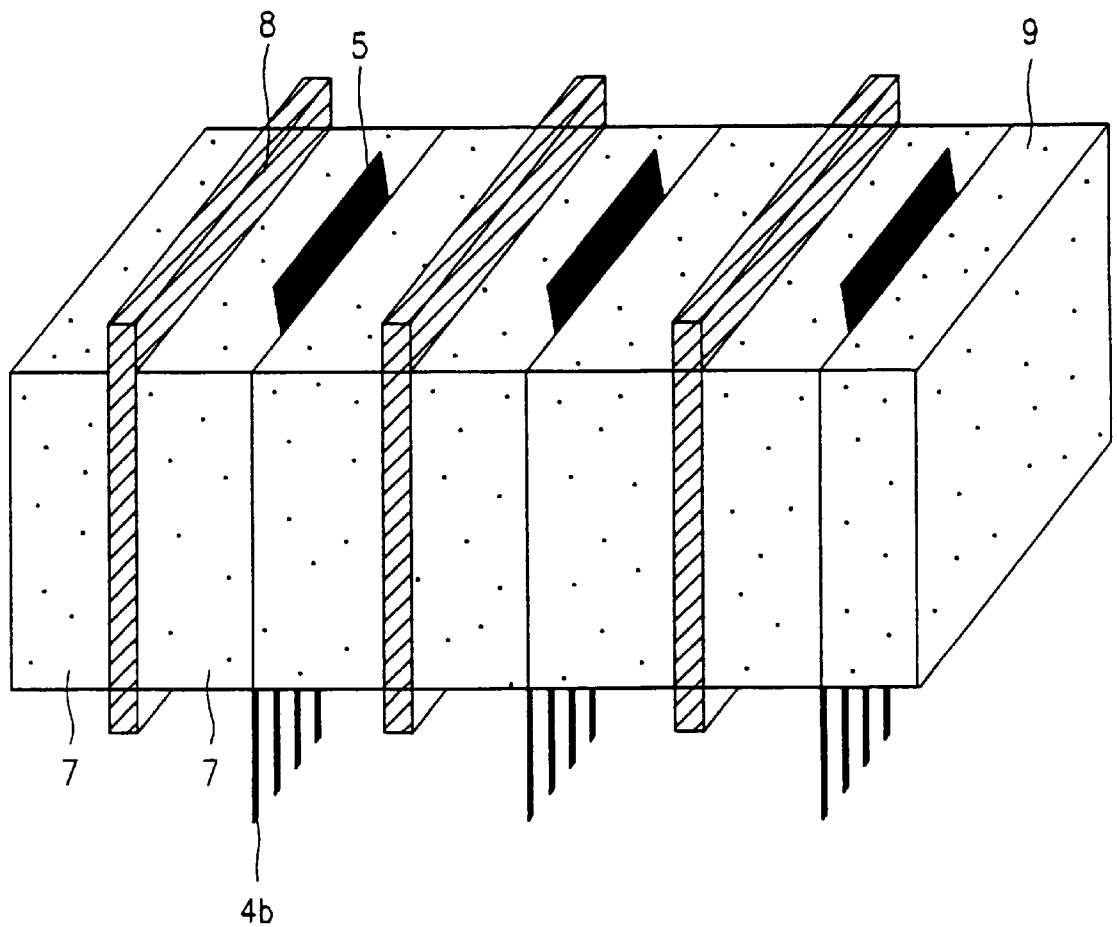
Figure 4:
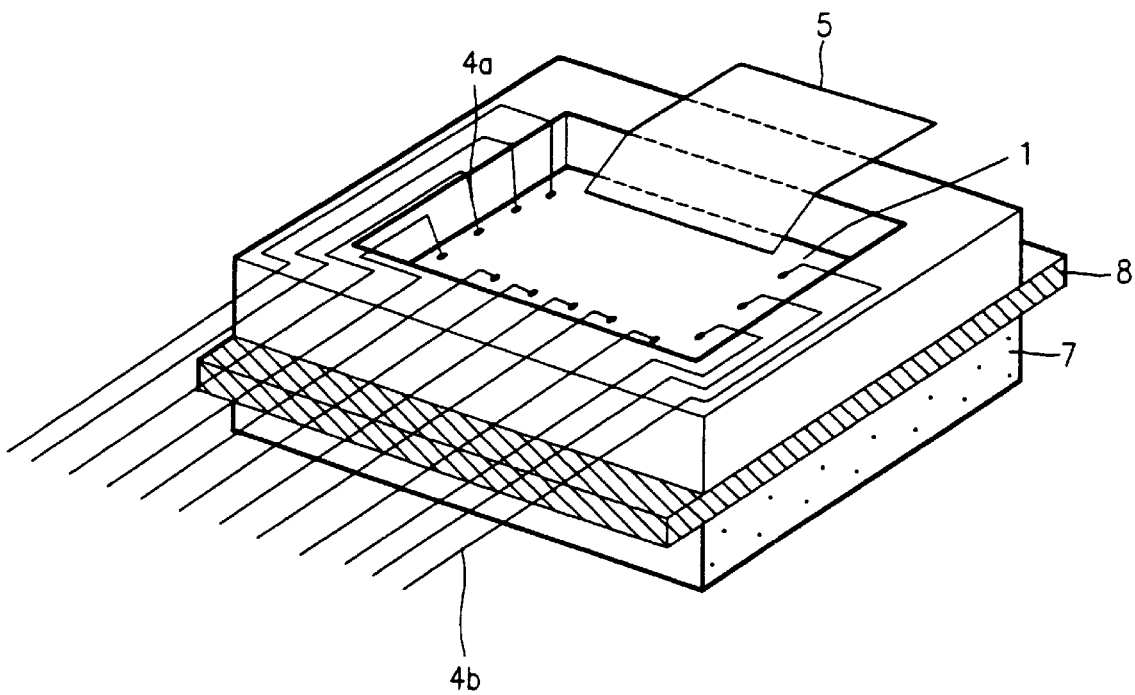
FIG. 4 shows arrangement of the leads of a stacked semiconductor package according to the present invention.

FIGS. 3A and 3B are a cross-sectional view and a perspective view, respectively, of a stacked semiconductor package according to the present invention and FIG. 4 shows arrangement of the leads of a stacked semiconductor package according to the present invention.

As shown in FIGS. 3A and 3B, a stacked semiconductor package includes internal leads 4a each connected to a conductive epoxy 3 on a wire bonding pad 2, external leads 4b extended from the internal leads 4a, a first heat sink 5 connected to a conductive epoxy 3 on a bonding pad 2 on a semiconductor chip 1, a becker 7 attached by an epoxy 6 under the semiconductor chip 1 and the internal leads 4a, a second heat sink 8 attached by the epoxy 6 under the semiconductor chip 1 and interposed into the becker 7 to radiate heat of the semiconductor chip 1, and a cap 9 placed over the semiconductor chip 1 to support the internal leads 4a and protect the semiconductor chip 1. At this time, instead of cap 9, other beckers 7 accompanying different kinds of semiconductor chips may be stacked.

As shown in FIG. 4, the internal and external leads 4a and 4b are arranged in a direction. The first heat sink 5, which is a lead frame, is formed to protrude in a direction opposite to the internal and external leads 4a and 4b. The second heat sink 8 is formed to protrude in both direction. These first and second heat sink 5 and 8 promote heat radiation, which is a problem in a stack structure.

As shown in FIG. 3B, a stacked semiconductor package can be inserted in a PCB (printed circuit board) using external leads 4b protruding in a direction by rotating the stacked semiconductor package by 90°. The stacked semiconductor chip, rotated by 90°, stands vertically so that the area the chip occupies is significantly reduced.

A method for assembling such semiconductor chips having the aforementioned structure will be described below.

First, a cap 9 supporting the internal leads 4a and protecting the semiconductor chip 1 as well as a becker 7 which a second heat sink 8 radiating out heat of the semiconductor chip 1 is attached to are fabricated. The reason that the beckers 7 should be fabricated in advance is that sizes of different kinds of semiconductor chips 1 mounted on the beckers 7 should be considered.

Subsequently, epoxy 6, used for chip die bonding, is pasted on an area of the surface of the becker 7 on which the semiconductor chip will be mounted. Besides, epoxy 6 is also pasted on areas of the surfaces of the cap 9 and the becker 7 which will contact the internal leads 4a.

Next, leads 4a and 4b which will be connected to bonding pads 2 on the semiconductor chip 1 are fabricated to protrude in a direction. And fabricated is a first heat sink 5 which will be connected to a wire bonding pad 2 on the semiconductor chip 1 to radiate out heat of the semiconductor chip 1. A lead frame is used as the first heat sink 5.

Thereafter, conductive epoxy 3 is pasted on the end of the first heat sink 5 and on end of the internal lead 4a which will be connected to the bonding pad 2.

Next, internal leads 4a, external leads 4b protruding from the internal leads 4a, and a first heat sink 5 are arranged over the semiconductor chip 1. While a cap 9 is arranged over the internal leads 4a, a becker 7 is arranged under the semiconductor chip 1. At this time, if a multiple package is desired, beckers 7 on which different types of semiconductor chips 1 are attached to are arranged and a cap 9 is finally arranged.

After arrangement, the internal leads 4a and the first heat sink 5 are attached to the wire bonding pads 2 on the semiconductor chip 1, the cap 9 to the internal leads 4a, and the becker 7 to the semiconductor chips 1 and the internal leads 4a at the same time when a predetermined strength is inflicted on the cap 9 and the lowest becker 7 by heat of about 160–170° C. That is, epoxy pasted on the different spots are simultaneously melt by the heat to bond all the portions. Thus, a plurality of semiconductor chips are simultaneously assembled, thereby realizing multichip IC with diverse functions and high performance.

Such a stacked semiconductor package and a method for assembling the same have the following advantages. First, it is unnecessary to fabricate a complex ceramic substrate and different kinds of semiconductor chips are installed vertically in a PCB so that the whole size can be significantly reduced. Further, since semiconductor packages are fabricated with one equipment in one process, the production cost becomes very lowered. Furthermore, since chips are isolated, it is easy to fine out which chip is defected and to repair it. Besides, it is possible to diverge individual semiconductor chips.

It will be apparent to those skilled in the art that various modification and variations can be made in the stacked semiconductor chip and the method for fabricating the same of the present invention without departing from the spirit or scope of the inventions. Thus, it is intended that the present invention cover the modifications and variations of this invention provided they come within the scope of the appended claims and their equivalents.

What is claimed is:

1. A stacked semiconductor package comprising:
    a semiconductor chip having a plurality of wire bonding pads thereon;
    leads formed in a first direction to electrically connect with the wire bonding pads;
    a first heat sink connected with the wire bonding pads to radiate heat of the semiconductor chip to outside of the semiconductor chip;
    a becker supporting the semiconductor chip together with the leads and the first heat sink;
    a second heat sink under the semiconductor chip to radiate heat of the semiconductor chip to the outside of the semiconductor chip; and
    a cap placed over the semiconductor chip to support the leads and the first heat sink and protect the semiconductor chip, wherein the first heat sink protrudes from the becker and the cap in a second direction opposite to the leads.

2. The stacked semiconductor package as claimed in claim 1, wherein said second heat sink protrudes in both directions of the becker.

3. The stacked semiconductor package as claimed in claim 1, wherein said first heat sink and the leads connected to the wire bonding pads are connected to conductive epoxy.

4. The stacked semiconductor package as claimed in claim 1, wherein said second heat sink is attached to epoxy beneath the semiconductor chip.

5. The stacked semiconductor package as claimed in claim 1, wherein epoxy is formed on surfaces of the beckers and the cap which contact the leads so as to support the leads.

6. The stacked semiconductor package as claimed in claim 1, wherein the second heat sink protrudes from the becker and cap in both directions of the first heat sink and the leads.

7. A stacked semiconductor package comprising:
    a plurality of semiconductor chips;
    a plurality of wire bonding pads formed on surface of each semiconductor chip;
    leads formed in a first direction to electrically connect with the wire bonding pads;
    a plurality of first heat sinks connected with the wire bonding pads to radiate heat of the semiconductor chips to outside of the semiconductor chips;
    a plurality of beckers each supporting each of the semiconductor chips together with the leads and the first heat sinks;
    a plurality of second heat sinks each under the semiconductor chips to radiate heat of the semiconductor chip to outside of the semiconductor chips; and a cap placed on an most outer upper portion over the semiconductor chips to support the leads and the first heat sinks and protect the semiconductor chip, wherein each of the first heat sinks protrudes from the beckers and the cap in a second direction opposite to the leads.

8. The stacked semiconductor package as claimed in claim 7, wherein the cap is replaced by beckers which different kinds of semiconductor chips are attached to, so as to realize a multiple stack.

9. The stacked semiconductor package as claimed in claim 7, wherein said second heat sink of the beckers protrudes in both directions of the beckers.

10. The stacked semiconductor package as claimed in claim 7, wherein each of the second heat sinks protrudes from the beckers and cap in both directions of the first heat sinks and the leads.

* * * * *